(12) United States Patent
Yeom et al.

(10) Patent No.: US 9,337,346 B2
(45) Date of Patent: May 10, 2016

(54) ARRAY SUBSTRATE AND METHOD OF FABRICATING THE SAME

(71) Applicant: LG DISPLAY CO., LTD., Seoul (KR)

(72) Inventors: Jung-Min Yeom, Paju-si (KR); Jeong-Yeon Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/504,048

(22) Filed: Oct. 1, 2014

(65) Prior Publication Data

US 2015/0123118 A1    May 7, 2015

(30) Foreign Application Priority Data

Nov. 7, 2013    (KR) .................. 10-2013-0134824

(51) Int. Cl.
*H01L 21/00*  (2006.01)
*H01L 29/786*  (2006.01)
*H01L 29/45*  (2006.01)

(52) U.S. Cl.
CPC ............ *H01L 29/7869* (2013.01); *H01L 29/45* (2013.01)

(58) Field of Classification Search
CPC ............ H01L 51/5012; H01L 51/0072; H01L 51/0067; H01L 51/5072; H01L 51/5206
USPC ................................ 438/85, 104, 754; 257/43
See application file for complete search history.

(56) References Cited

U.S. PATENT DOCUMENTS

| | | | | |
|---|---|---|---|---|
| 2005/0285233 | A1* | 12/2005 | Huang et al. ................. | 257/646 |
| 2008/0318368 | A1* | 12/2008 | Ryu et al. ..................... | 438/151 |
| 2010/0109708 | A1* | 5/2010 | Koyama et al. .............. | 326/96 |
| 2013/0228756 | A1* | 9/2013 | Lee .............................. | 257/40 |

FOREIGN PATENT DOCUMENTS

| | | |
|---|---|---|
| TW | 200801745 A | 1/2008 |
| TW | 200805665 A | 1/2008 |
| TW | 200910602 A | 3/2009 |

OTHER PUBLICATIONS

Hymes, S., Sp P. Murarka, C. Shepard, and W. A. Lanford. "Passivation of copper by silicide formation in dilute silane." Journal of applied physics 71, No. 9 (1992): 4623-4625.*

* cited by examiner

*Primary Examiner* — Andy Huynh
(74) *Attorney, Agent, or Firm* — Dentons US LLP

(57) ABSTRACT

An array substrate for an electronic display includes a substrate; a gate electrode on the substrate; a gate insulating layer on the gate electrode; an oxide semiconductor layer on the gate insulating layer; a source electrode and a drain electrode on the oxide semiconductor layer; a silicide layer on the source and drain electrodes; and a first passivation layer on the source electrode and the drain electrode. The array substrate and fabrication method thereof prevent degradation of a thin-film transistor (TFT) used in driving pixels of the electronic display.

10 Claims, 6 Drawing Sheets

ARRAY SUBSTRATE AND METHOD OF FABRICATING THE SAME

The present application claims the priority benefit of Korean Patent Application No. 10-2013-0134824 filed in Republic of Korea on Nov. 7, 2013, which is hereby incorporated by reference in its entirety for all purposes as if fully set forth herein.

BACKGROUND

1. Field of the Disclosure

The present disclosure relates to an array substrate, and particularly, an array substrate including an oxide semiconductor layer and a method of fabricating the same.

2. Discussion of the Related Art

Recently, facing an information laden society, a field of processing and displaying mass information has rapidly advanced, and many kinds of flat display devices are developed and highly favored.

As the flat display devices, liquid crystal display devices (LCDs), plasma display panel device (PDPs), field emission display devices (FEDs), electroluminescent display device (ELDs), organic light emitting diodes (OLEDs) are used. These display devices have advantages of thin profile, lightweight, and low power consumption, and are rapidly substituted for conventional cathode ray tubes (CRTs).

The flat display device typically includes an array substrate where a thin film transistor (TFT) as a switching element turning on/off a pixel is formed in each pixel.

For the purpose of explanation, an LCD most widely used among the flat display devices is illustrated in connection with the figures. The LCD has advantages of high performance in displaying moving images and high contrast ratio and is used for laptop computers, desktop monitors, TVs, or the like.

FIG. 1 is a cross-sectional view illustrating an array substrate for an LCD according to the related art.

Referring to FIG. 1, the array substrate 10 includes a plurality of gate lines on a substrate 1, and a plurality of data lines 15 crossing the gate lines to define a plurality of pixel regions P.

A TFT T is formed at a switching region near a crossing portion of the gate line and the data line 15. A common electrode 21 and a pixel electrode 25 are also formed at a display region and used in displaying an image.

The TFT T includes a gate electrode 3, a gate insulating layer 5, an oxide semiconductor layer 7, and source and drain electrodes 11 and 13, respectively.

An etch stopper 9 is formed between the source and drain electrodes 11 and 13 and the oxide semiconductor layer 7, and includes semiconductor contact holes 9a exposing each of both side portions of the oxide semiconductor layer 7. The source and drain electrodes 11 and 13 contact the respective side portions of the oxide semiconductor layer 7 through the respective semiconductor contact holes 9a.

A first passivation layer 17 is formed on the entire surface of the substrate 1 having the TFT T, and a second passivation layer 19 is formed on the first passivation layer. The common electrode 21 is formed on the second passivation layer 19 corresponding to the entire display region and is made of a transparent conductive material.

A third passivation layer 23 is formed on the common electrode 21. The first to third passivation layers 17, 19, and 23 include a drain contact hole 13a exposing the drain electrode 13.

The pixel electrode 25 is formed on the third passivation layer 23 in each pixel region P and contacts the drain electrode 13 through the drain contact hole 13a.

The pixel electrode 25 includes a plurality of bar-shaped openings OP therein, and thus, produces a fringe electric field along with the common electrode 21 therebelow.

The above-described array substrate 10 is used for a fringe field switching mode LCD.

In the array substrate 10, the oxide semiconductor layer 7 is reacted with hydrogen gas when depositing the first passivation layer 17, and thus, hydrogen atoms act as a carrier in the oxide semiconductor layer 7. This causes a problem in that the oxide semiconductor layer 7 then changes into a conductor. Further, the semiconductor layer 7 has an increase in propensity for oxygen vacancy generation due to ionic bonds, and this causes an increase of electron density.

Particularly, when forming the source and drain electrodes 11 and 13, oxygen concentration at a back channel region after dry-etching or wet-etching remarkably decreases. Thus, the oxide semiconductor layer 7 changes into a conductor, and caused increased leakage in the TFT.

To solve the above problems, the etch stopper 9 is formed so that the oxide semiconductor layer 7 is not exposed to hydrogen gas during deposition of the first passivation layer 17. However, this causes problems of more complicated design and processes with an associated increase of production costs.

Further, defect frequency increases, and thus, production efficiency is reduced.

Particularly, metal wire such as the source and drain electrodes is formed using low-resistance metal materials such as copper (Cu) in order to achieve display devices having large size and high resolution, and in this case, oxidation of metal wire is caused due to a high oxidation property of Cu and thus, leakage current occurs from the TFT. Therefore, reliability of the TFT element is reduced.

SUMMARY

Accordingly, the present disclosure is directed to an array substrate and a method of fabricating the same that can improve reliability of an oxide semiconductor and adjust properties of the oxide semiconductor to minimize deterioration, obtain production simplification by reducing production processes, prevent leakage current, and increase reliability of a TFT element by preventing oxidation of metal wire made of a material such as copper.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims as well as the appended drawings.

To achieve these and other advantages, and in accordance with the purpose of the present disclosure, as embodied and broadly described herein, an array substrate includes a substrate; a gate electrode on the substrate; a gate insulating layer on the gate electrode; an oxide semiconductor layer on the gate insulating layer; source and drain electrodes on the oxide semiconductor layer; a silicide layer on the source and drain electrodes; and a first passivation layer on the source and drain electrodes.

In another aspect, a method of an array substrate includes forming a gate electrode, a gate insulating layer, an oxide semiconductor layer, source and drain electrodes, on a substrate; injecting a gas mixture containing silane ($SiH_4$) onto the source and drain electrodes to form a silicide layer on the source and drain electrodes; performing a surface treatment for a back channel region of the oxide semiconductor layer between the source and drain electrodes having the silicide layer thereon; and forming a first passivation layer on the source and drain electrodes.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION OF THE PREFERRED EMBODIMENTS

Reference will now be made in detail to exemplary embodiments, examples of which are illustrated in the accompanying drawings.

Figure 2:
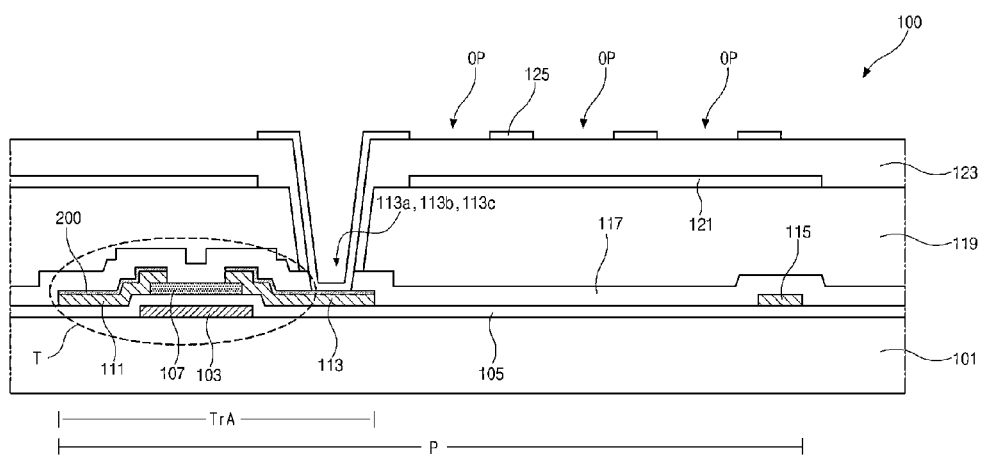
FIG. 2 is a cross-sectional view illustrating an array substrate for an LCD according to an exemplary embodiment of the present disclosure.

FIG. 2 is a cross-sectional view illustrating an array substrate for an LCD according to an embodiment of the present disclosure.

Referring to FIG. 2, the array substrate 100 may include a plurality of gate lines (not shown) spaced apart from each other on a substrate 101, and a plurality of data lines 115 crossing the plurality of gate lines to define respective pixel regions P.

A TFT T may be formed at a switching region TrA near a crossing portion of the gate line and the data line 115, and a pixel electrode 125 may be formed at a display region to displaying an image.

A gate electrode 103 may be formed at the switching region TrA, and a gate insulating layer 105 may be formed on the entire surface of the substrate 101 having the gate electrode 103.

An oxide semiconductor layer 107 may be formed on the gate insulating layer 105 over the gate electrode 103. Source and drain electrodes 111 and 113, respectively, may be formed on the oxide semiconductor layer 107 and spaced apart from each other.

The gate electrode 103, the gate insulating layer 105, the oxide semiconductor layer 107, and the source and drain electrodes 111 and 113 form the TFT T at the switching region TrA.

A TFT T using an oxide semiconductor has field-effect mobility of several times to hundreds of times greater than that of a TFT using amorphous silicon.

For example, when an oxide semiconductor material containing at least one of zinc oxide, tin oxide, Ga—In—Zn oxide, and In—Sn oxide, which each have amorphous structure, or doped with at least one of Al, Ni, Cu, Ta, Mo, Hf, and Ti, can have field-effect mobility of at least 20 times greater than that of amorphous silicon.

Further, the oxide semiconductor layer 107 can have high mobility even though deposited at low temperature, and thus, reliability can be increased.

It is preferred, but not limited, that at least one of the gate electrode 103, the gate line, the source and drain electrodes 111 and 113, and the data line 115 have a multiple-layered structure, for example, double-layered structure that includes a lower layer made of one of Mo, Ti, and MoTi, and a upper layer made of low-resistance metal material such as Cu on the lower layer.

In this case, Mo, Ti, and MoTi have good adhesion onto the substrate 101, e.g., made of glass material, and function to improve coupling of the Cu layer to the substrate 101.

Further, using a multiple-layered structure with the Cu layer allows a width of signal wire to be reduced, and an increase of wire resistance can be prevented even though a length of the signal wire increases.

In this regard, to achieve an LCD device having a large size and high resolution, reduction of the width and an increase in length of the signal wire are required, which causes an increase of wire resistance. Accordingly, current or voltage supplied to the pixel region P is not uniform, and display quality is degraded.

Therefore, reducing wire resistance is needed, and to do this, a low-resistance metal material such as Cu, Ag, or the like can be used to form the metal wire in the display device.

Particularly, processing to pattern Cu is easier than that of patterning Ag. Also, specific resistance of Cu is about 30% or less of that of Al. For example, Cu has specific resistance of about 2.1 to about 2.3 μΩcm and Al has specific resistance of about 3.1 μΩcm. Also, Cu has a better tolerance to hillock than Al.

Accordingly, because the gate electrode 103, the gate line, the source and drain electrodes 111 and 113, and the data line 115 are formed using Cu of low resistance, even though the display device has a large size and high resolution, signal delay can be prevented. Thus, operational problems can be prevented due to voltage drop, or non-uniform current or voltage supplied to the pixel region P causing a degradation of display quality.

Further, assuming that wire resistance is the same as that of the related art, a width of the patterned wire can be much reduced, and aperture ratio can be increased.

To address this problem in the present disclosure, the TFT T may include a silicide layer 200 formed on the source and drain electrodes 111 and 113.

Accordingly, even though the TFT T includes the oxide semiconductor layer 107 and the metal wires contains Cu, degradation of operational properties of the TFT T can be avoided and an etch stopper (9 of FIG. 1) can be eliminated. Accordingly, the production process can be simplified, and production efficiency can be improved.

Further, oxidation of the metal wire using Cu can be prevented, and thus, current leakage and reduction of reliability due to the current leakage can also be prevented.

Figure 1:
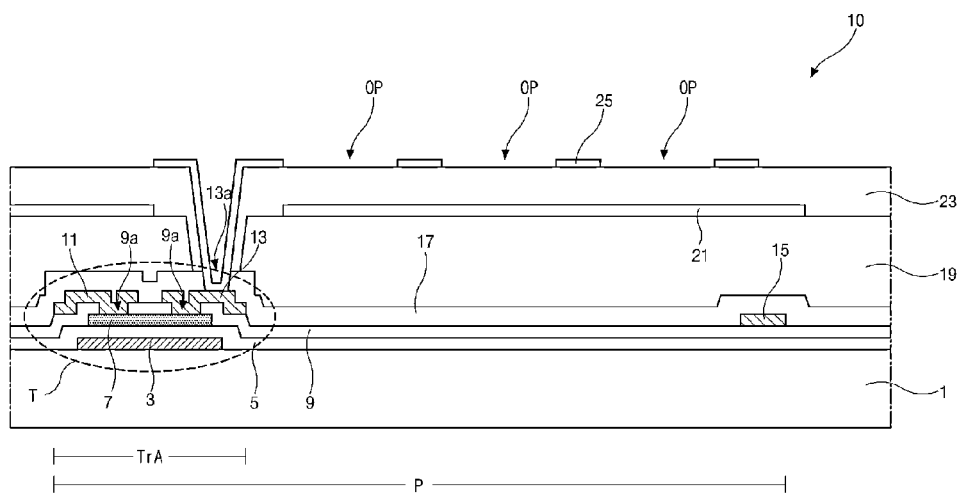
FIG. 1 is a cross-sectional view illustrating an array substrate for an LCD according to the related art.

Referring to FIG. 1, a first passivation layer 117 may be formed on the entire surface of the substrate 101 having the TFT T, and may be made of an inorganic insulating material, for example, silicon oxide ($SiO_2$). A second passivation layer 119 may be formed on the first passivation layer 117, and may be made of an organic insulating material, for example, photo acryl. The second passivation layer 119 may have a flat surface.

A common electrode 121 may be formed on the second passivation layer 119 corresponding to the entire display region. A part of the common electrode 121 corresponding to each switching region TrA may be removed, and thus, parasitic capacitance due to overlapping the common electrode 121 and the source and drain electrodes 111 and 113 can be reduced.

A third passivation layer 123 may be formed on the common electrode 121. The first to third passivation layers 117, 119, and 123 may include drain contact holes 113a, 113b, and 113c, respectively, exposing the drain electrode 113.

A pixel electrode 125 may be formed on the third passivation layer 123 in each pixel region P and contact the drain electrode 113 through the drain contact holes 113a, 113b, and 113c.

The pixel electrode 125 in each pixel region P may include a plurality of bar-shaped openings OP. According to this configuration of the pixel electrode 125, the array substrate 100 may be used for a fringe field switching (FFS) mode LCD.

As described above, the array substrate 100 may include the TFT T using the oxide semiconductor layer 107, and the metal wires using Cu of low resistance, and thus, the etch stopper of the related art can be eliminated, and degradation of the TFT T can be avoided.

Accordingly, production processes can be simplified and production efficiency can be improved.

Further, oxidation of the metal wire using Cu can be prevented, and reduction of reliability due to current leakage can also be prevented.

In this exemplary embodiment, instead of forming the related art etch stopper, a surface treatment on the back channel region of the oxide semiconductor layer 107 using oxygen may be performed before depositing the first passivation layer 117. Accordingly, oxygen is supplemented at the surface of the back channel where oxygen was reduced by the prior art processes. Also, converting the surface of the oxide semiconductor layer 107 into an insulating material using an oxygen surplus can minimize current leakage at the back channel region. Accordingly, degradation of property of the TFT T can be prevented.

The surface treatment may be conducted using an oxygen ($O_2$) treatment, ozone ($O_3$) treatment, a thermal treatment under an oxygen atmosphere, or the like.

Cu used for the metal wires such as the source and drain electrodes 111 and 113 and the data line 115 is easily oxidized. Accordingly, it is difficult to conduct the surface treatment of the oxide semiconductor layer 107.

Here, the silicide layer 200 functions to prevent the source and drain electrode 111 and 113 from being exposed to oxygen ($O_2$) or ozone ($O_3$) in the surface treatment for the oxide semiconductor layer 107. Accordingly, current leakage due to the oxidation of the metal wire can be prevented, and reliability can be improved.

Further, the silicide layer 200 functions as a diffusion barrier layer for Cu used in the source and drain electrodes 111 and 113.

In other words, Cu ions of the source and drain electrodes 111 and 113 diffuse to the first passivation layer 117 made of oxide silicon ($SiO_2$), and an insulation property of the first passivation layer 117 is reduced. However, in the embodiment, the silicide layer 200 is formed on the source and drain electrodes 111 and 113, and the diffusion of the Cu ions can be prevented.

Also, oxidation can be prevented by the silicide layer 200.

A method of fabricating the array substrate 100 for the LCD of the embodiment is explained as follows.

FIGS. 3A to 3I are cross-sectional views illustrating the array substrate for the LCD according to an embodiment of the present disclosure.

Figure 3A:
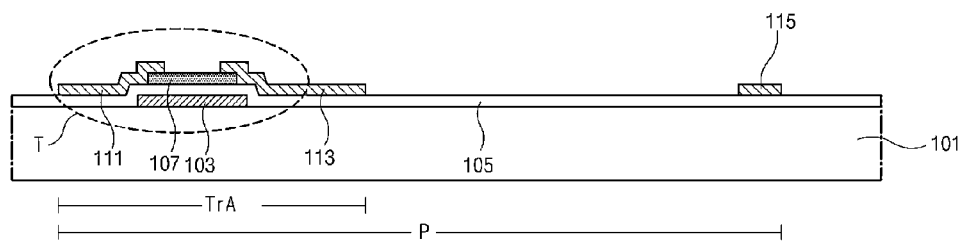
FIGS. 3A to 3I are cross-sectional views illustrating the array substrate for the LCD according to the exemplary embodiment of the present disclosure.

Referring to FIG. 3A, a gate electrode 103, a gate line (not shown), a gate insulating layer 105, an oxide semiconductor layer 107, source and drain electrodes 111 and 113, and a data line 115 may be formed on a transparent substrate 101.

The gate electrode 103, the gate insulating layer 105, the oxide semiconductor layer 107, and the source and drain electrodes 111 and 113 form a TFT Tr in a switching region TrA.

The gate electrode 103, the gate line, the source and drain electrodes 111 and 113, and the data line 115 may have a double-layered structure that includes a first layer of Mo, Ti, or MoTi, and a second layer, on the first layer, of Cu having low resistance.

The first layer functions to improve adhesion between the substrate 101 and the second layer of Cu.

The gate insulating layer 105 may be formed, for example, in a PECVD (plasma enhanced chemical vapor deposition) method, and be made of an inorganic insulating material, for example, silicon oxide ($SiO_2$) or silicon nitride (SiNx).

The oxide semiconductor layer 107 may be made of one of zinc oxide, tin oxide, Ga—In—Zn oxide, and In—Sn oxide, which each have amorphous structure, such the one doped with one of Al, Ni, Cu, Ta, Mo, Hf, and Ti using a sputtering method. The oxide semiconductor layer 107 may be patterned using a mask process so that the oxide semiconductor layer 107 having an island shape is formed corresponding to the gate electrode 103.

Figure 3B:
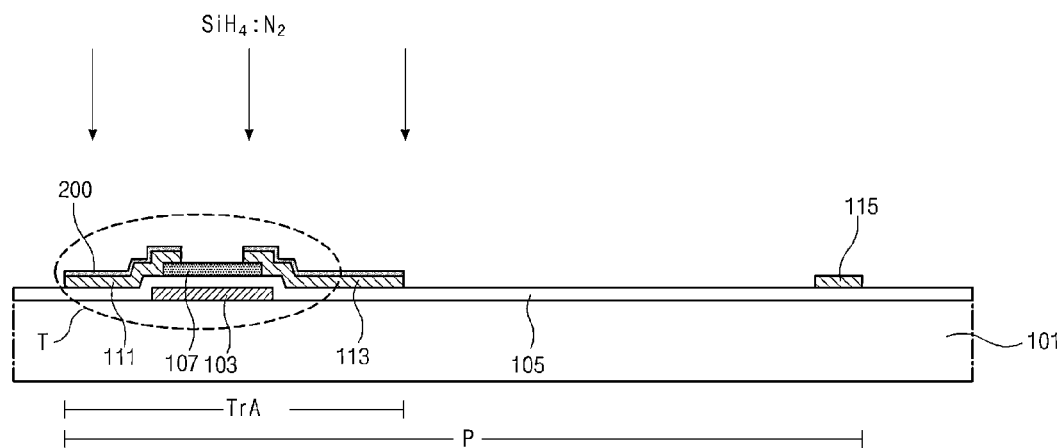

Referring to FIG. 3B, a gas mixture containing silane ($SiH_4$) may be injected onto the source and drain electrodes 111 and 113.

The gas mixture may be a mixture of silane ($SiH_4$) and nitrogen ($N_2$), or a mixture of silane ($SiH_4$), nitrogen ($N_2$), and one of helium (He) and argon (Ar).

When the gas mixture containing silane and nitrogen is injected onto the source and drain electrodes 111 and 113, silicon of silane is diffused into Cu of the source and drain electrodes 111 and 113 so that a silicide layer 200 is formed at the surfaces of the source and drain electrodes 111 and 113.

The silicide layer 200 functions to prevent the source and drain electrodes 111 and 113 using Cu from being oxidized during the surface treatment process for the oxide semiconductor layer 107 or when depositing a first passivation layer 117 made of silicon oxide ($SiO_2$).

Further, the silicide layer 200 functions to prevent Cu ions from being diffused to the first passivation layer 117 of silicon oxide ($SiO_2$).

By using the silicide layer 200, an etch stopper can be eliminated without degradation of the TFT T, and thus, production processes can be simplified and production efficiency can be improved.

Further, because the oxidation of the metal wire using Cu can be prevented, current leakage in the TFT can be prevented.

Figure 3C:
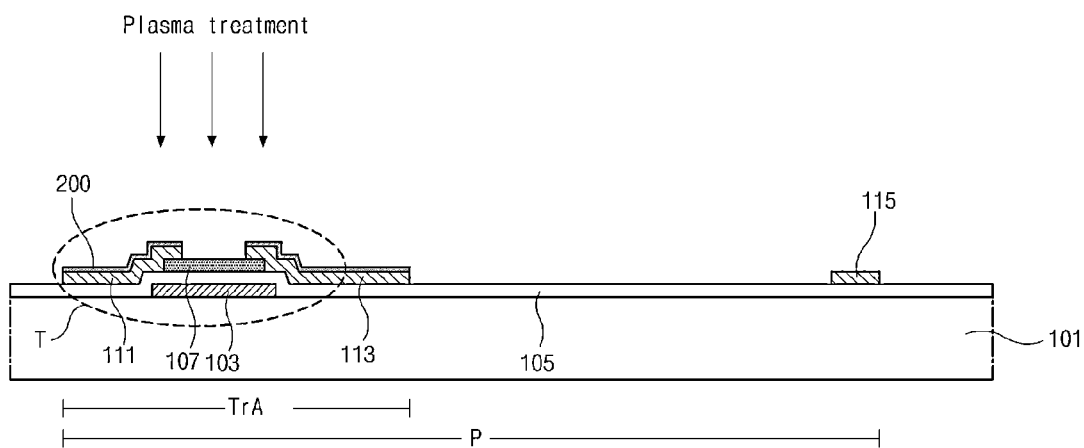

Then, referring to FIG. 3C, a surface treatment may be conducted for a back channel region of the oxide semiconductor layer 107 exposed between the source and drain electrodes 111 and 113. The surface treatment may be an oxygen plasma treatment, an ozone treatment, or a thermal treatment in an oxygen rich atmosphere.

For an example, the back channel region of the oxide semiconductor layer 107 may be surface-treated using the oxygen plasma treatment, and this treatment may be conducted under at a power of about 10 W to about 2000 W, and a oxygen flow rate of about 10 sccm to about 100 sccm.

In another example, the back channel region may be surface-treated using an ozone treatment through UV irradiation in an ozone atmosphere. In yet another example, the back channel region may be surface-treated using heat of about 100 degrees Celsius to about 300 degrees Celsius.

Through the surface treatment as described above, the problem that the oxide semiconductor layer 107 is reacted with hydrogen gas when depositing the first passivation layer 117 and changed into a conductor can be prevented.

Further, the problem that the semiconductor layer 107 is more susceptible to oxygen vacancy generation due to ionic bonds increasing electron density can be prevented. Further, the problem that when forming the source and drain electrodes 111 and 113, oxygen concentration at the back channel region after dry-etching or wet-etching remarkably decreases, and thus the oxide semiconductor layer 107 changes into a conductor can be prevented.

Accordingly, deterioration of current leakage of the oxide semiconductor layer 107 can be prevented.

Particularly, even though the source and drain electrodes 111 and 113 use Cu of low resistance, since the silicide layer 200 is formed on the source and drain electrodes 111 and 113, the source and drain electrodes 111 and 113 are not affected by the surface treatment of the oxide semiconductor layer 107. Thus, oxidation of the source and drain electrodes 111 and 113 can be prevented.

Figure 3D:
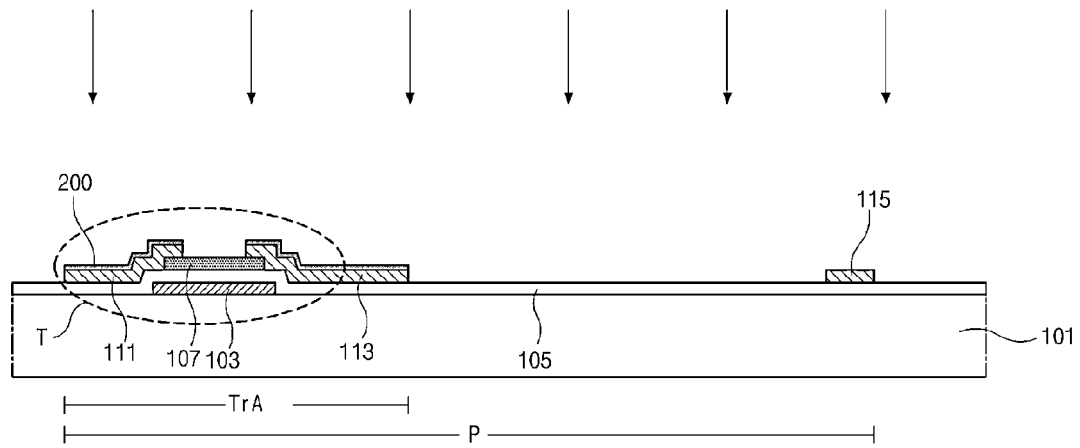

Referring to FIG. 3D, the first passivation layer 117 may be formed on the substrate 101 having the surface-treated oxide semiconductor layer 107 by ionizing a gas mixture containing silane ($SiH_4$) and nitrous oxide ($N_2O$) and depositing the ionized gas, using a PECVD. Then, referring to FIG. 3E, the first passivation layer 117 may be patterned in a mask process to form a first drain contact hole 113a.

Figure 3E:
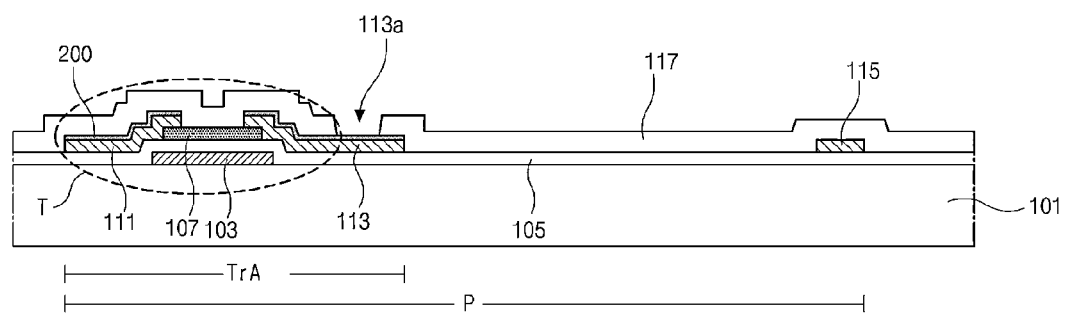

The process of forming the silicide layer 200 in FIG. 3B, the process of surface-treating the oxide semiconductor layer 107 in FIG. 3C, and the process of forming the passivation layer in FIGS. 3D and 3E may be performed continuously in the same chamber. In this case, in the process of forming the silicide layer 200, the gas mixture containing silane is injected to grow the silicide layer 200 with the power of the chamber off.

In other words, the gas mixture containing silane is injected onto the source and drain electrodes 111 and 113 in a state that the gas mixture is not ionized.

Figure 3F:
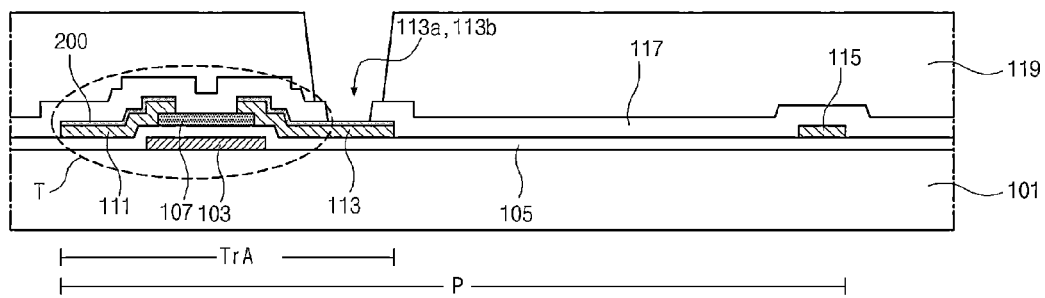

Referring to FIG. 3F, an organic material, for example, photo acryl may be deposited on the first passivation layer 117 to form a second passivation layer 119, and the second passivation layer 119 may be patterned using a mask process to form a second drain contact hole 113b corresponding to the first drain contact hole 113a and exposing the drain electrode 113.

Alternatively, the first and second drain contact holes 113a and 113b, respectively, may be simultaneously formed in a method of forming the first and second passivation layers 117 and 119, and then patterning the first and second passivation layers 117 and 119. In other words, the first and second drain contact holes 113a and 113b can be formed in the same mask process.

Figure 3G:
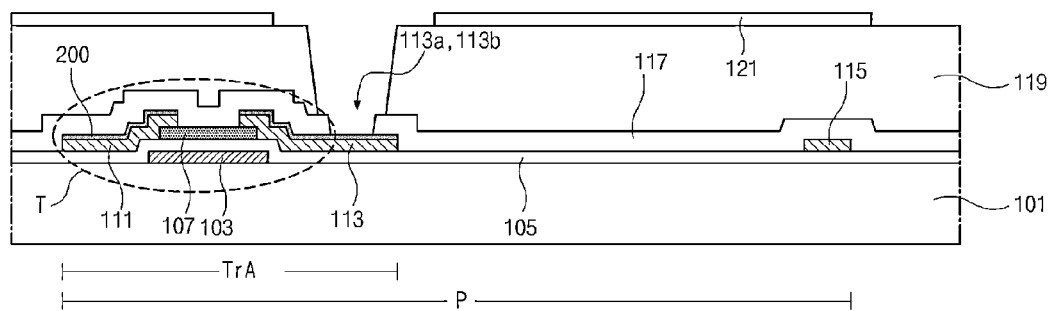

Referring to FIG. 3G, a transparent conductive material, for example, indium-tin-oxide (ITO) or indium-zinc-oxide (IZO) may be deposited on the second passivation layer 119, and patterned using a mask process to form a common electrode 121. The common electrode 121 may be formed on the entire display region, and have an opening corresponding to at least part of each switching region TrA.

Figure 3H:
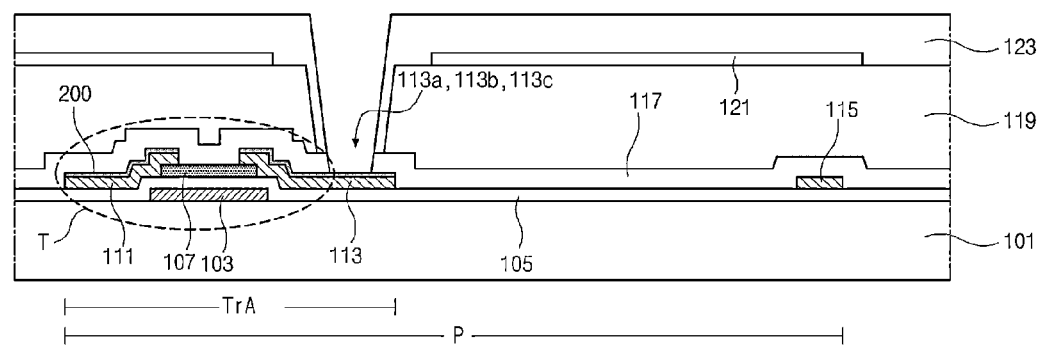

Referring to FIG. 3H, an inorganic insulating material, for example, silicon oxide or silicon nitride may be deposited on the common electrode 121 to form a third passivation layer 123. Then, the third passivation layer 123 may be patterned in a mask process to form a third drain contact hole 113c, corresponding to the first and second drain contact holes 113a and 113b, and exposing the drain electrode 113.

Figure 3I:
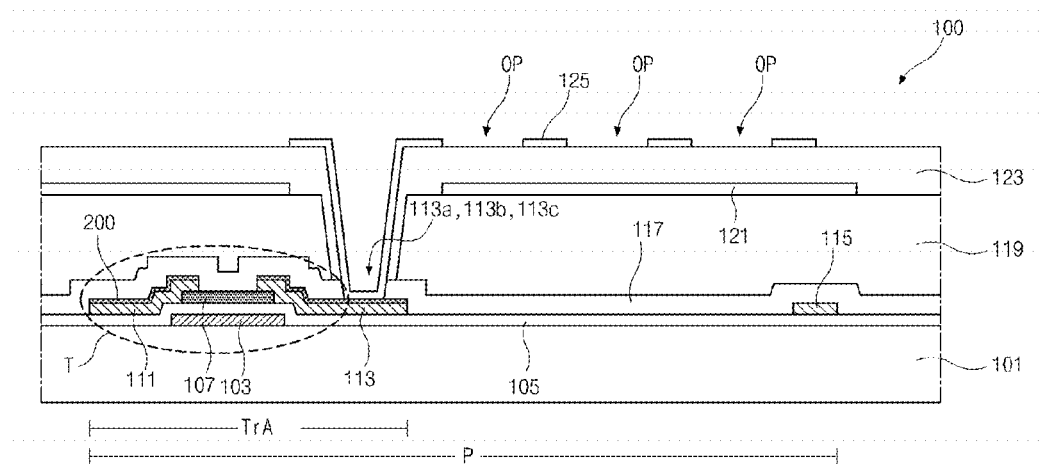

Referring to FIG. 3I, a transparent conductive material, for example, indium-tin-oxide (ITO) or indium-zinc-oxide (IZO) may be deposited on the third passivation layer 123, and patterned using a mask process to form a pixel electrode 125 in each pixel region P. The pixel electrode 125 may contact the drain electrode 113 through the first to third drain contact holes 113a to 113c, and includes a plurality of openings OP in each pixel region P.

Through the above-described processes, the array substrate 100 may be fabricated. This array substrate 100 may be used as an array substrate for a FFS mode LCD.

Alternatively, a pixel electrode having a plate shape may be formed in each pixel region on an array substrate, a common electrode may be formed on a substrate opposing to the array substrate, and the array substrate and the opposing substrate are attached to form a twisted nematic (TN) mode LCD, electronic controlled birefringence (ECB) mode LCD, or vertical alignment (VA) mode LCD.

Alternatively, a bar-shaped pixel electrode and a bar-shaped common electrode may be alternated in each pixel region at an array substrate, and this array substrate may be an array substrate used for an in plane switching (IPS) mode LCD.

Also, the array substrate of the embodiment can be applied as an array substrate for other flat display devices such as an OLED device.

As described above, in the array substrate 100, the silicide layer 200 may be formed on the source and drain electrodes 111 and 113, and the surface treatment may be performed for the back channel region of the oxide semiconductor layer 107. Accordingly, even though the TFT T may include the oxide semiconductor layer 107 and the metal wires use Cu layer of low resistance, the etch stopper can be eliminated and degradation of the TFT T can be prevented.

Figure 4A:
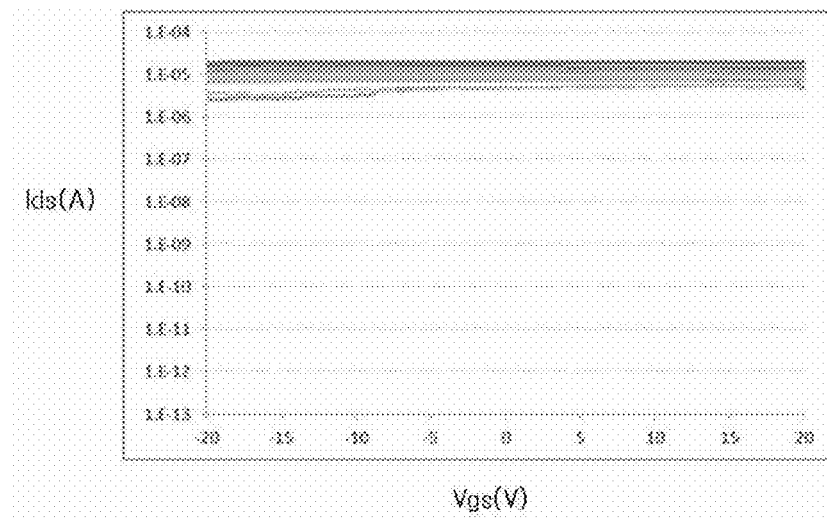
FIGS. 4A and 4B are graphs illustrating transfer properties of TFTs including oxide semiconductor layers according to a comparative example and the exemplary embodiment of the present disclosure, respectively.
Figure 4B:
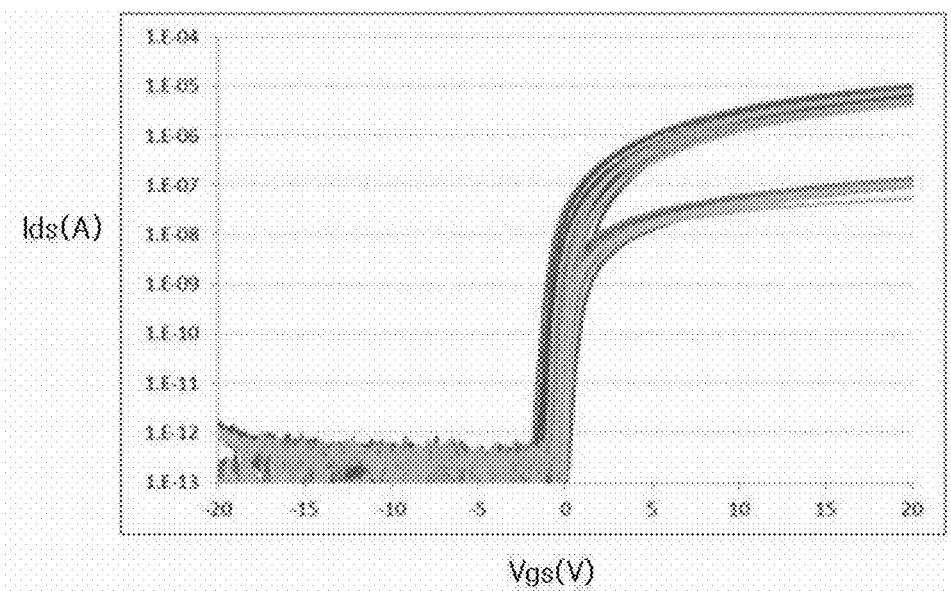

FIGS. 4A and 4B are graphs illustrating transfer properties of TFTs including oxide semiconductor layers according to a comparative example and the embodiment of the present disclosure, respectively. FIGS. 4A and 4B each shows a relationship of drain current to gate voltage with a drain voltage kept at 0.1V and 10V.

In the comparative example, the etch stopper is eliminated from the related art array substrate through process simplification. Accordingly, referring to FIG. 4A, the voltage-to-current transfer curve shows that the comparative TFT does not have properties of a switching element, but is a conductor.

However, in the disclosed embodiment, the silicide layer 200 may be formed on the source and drain electrodes 111 and 113, and the surface treatment may be conducted for the back channel region of the oxide semiconductor layer 107. In this case, referring to FIG. 4B, the TFT T of the disclosed embodiment has properties of a switching element.

In other words, in the disclosed embodiment, since the silicide layer 200 may be formed on the source and drain electrodes 111 and 113, and the surface treatment may be conducted for the back channel region of the oxide semiconductor layer 107, production process can be simplified, and degradation of the TFT T can be prevented. Further, oxidation of the metal wires using Cu can be prevented, and thus, reduction of reliability due to current leakage can be prevented.

Figure 5A:
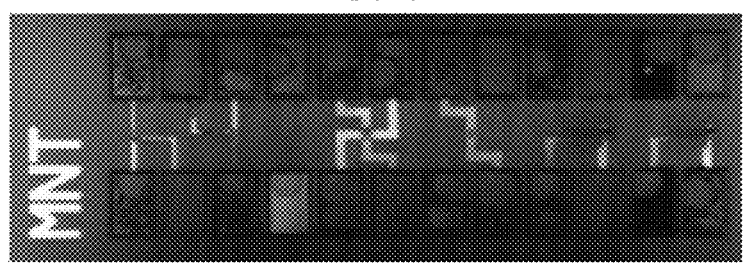
FIG. 5A illustrates an occurrence of oxidation of metal wires using Cu not having silicide layer thereon.

In other words, in case that the silicide layer 200 is not formed on the source and drain electrodes 111 and 113, the source and drain electrodes 111 and 113 are oxidized by the surface treatment for the oxide semiconductor layer 107. This is shown in FIG. 5A, illustrating an occurrence of oxidation of metal wires using Cu not having silicide layer thereon. When the oxidation occurs, a reduction of reliability is caused by leakage current.

Figure 5B:
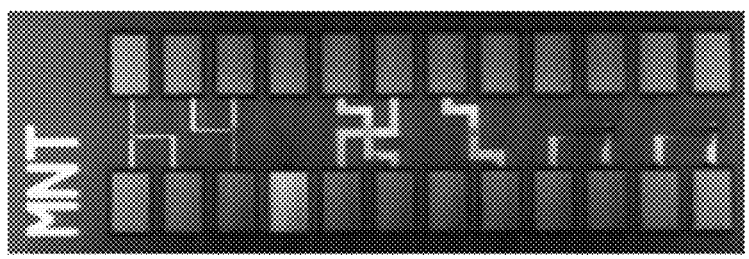
FIG. 5B, illustrates no occurrence of oxidation of metal wires using Cu and having the silicide layer thereon according to the exemplary embodiment of the present disclosure.

However, in the disclosed embodiment, because of the silicide layer 200, the oxidation of the source and drain electrodes 111 and 113 can be prevented. This is shown in FIG. 5B, illustrating no occurrence of oxidation of metal wires using Cu having the silicide layer thereon.

As described above, when the silicide layer 200 is formed on the source and drain electrodes 111 and 113, the oxidation of the source and drain electrodes 111 and 113 using Cu can be prevented. Therefore, reduction of reliability due to current leakage can be prevented.

It will be apparent to those skilled in the art that various modifications and variations can be made in a display device of the present disclosure without departing from the sprit or scope of the disclosure. Thus, it is intended that the present disclosure covers the modifications and variations of this disclosure provided they come within the scope of the appended claims and their equivalents.

What is claimed is:

1. A method of fabricating an array substrate, comprising:
    forming a gate electrode, a gate insulating layer, an oxide semiconductor layer, a source electrode and a drain electrode, on a substrate;
    injecting a gas mixture containing silane ($SiH_4$) onto the source electrode and the drain electrode to form a silicide layer on the source electrode and the drain electrode;
    performing a surface treatment for a back channel region of the oxide semiconductor layer between the source electrode and the drain electrode having the silicide layer thereon; and
    forming a first passivation layer on the source electrode and the drain electrode,
    wherein injecting the gas mixture, performing the surface treatment, and forming the first passivation layer are conducted in a same chamber, and
    wherein the gas mixture is injected onto the source and the drain electrodes in a state that the gas mixture is not ionized.

2. The method of claim 1, wherein the gas mixture contains one of nitrogen ($N_2$), helium (He), and argon (Ar).

3. The method of claim 1, wherein the surface treatment is performed using one of an oxygen ($O_2$) plasma treatment, an ozone ($O_3$) treatment, and a thermal treatment in an oxygen atmosphere.

4. The method of claim 3, wherein the oxygen plasma treatment is performed with oxygen injection.

5. The method of claim 3, wherein the ozone treatment is performed with UV irradiation in an ozone atmosphere.

6. The method of claim 3, wherein the thermal treatment in an oxygen atmosphere is performed with heat of 100 degrees Celsius to 300 degrees Celsius.

7. The method of claim 1, wherein the first passivation layer is formed using a gas mixture containing silane ($SiH_4$) and nitrous oxide ($N_2O$).

8. The method of claim 1, wherein in forming the gate electrode, the source electrode, and the drain electrode have a double-layered structure that includes a first layer of one of Mo, Ti, and MoTi, and a second layer of Cu on the first layer.

9. The method of claim 1, further comprising forming a pixel electrode connected to the drain electrode after the step of forming a first passivation layer on the source electrode and the drain electrode.

10. The method of claim 9, further comprising:
    forming a second passivation layer on the first passivation layer;
    forming a common electrode on the second passivation layer; and
    forming a third passivation layer on the common electrode,
    wherein the pixel electrode is on the third passivation layer, and includes a plurality of bar-shaped openings, and contacts the drain electrode through respective drain contact holes in the first to the third passivation layers.

* * * * *